(12) United States Patent  
Yoon (10) Patent No.: US 9,072,188 B2  
(45) Date of Patent: Jun. 30, 2015

(54) PACKAGE SUBSTRATE, METHOD OF MANUFACTURING THE PACKAGE SUBSTRATE AND SEMICONDUCTOR PACKAGE INCLUDING THE PACKAGE SUBSTRATE

(71) Applicant: Samsung Electronics Co., Ltd., Suwon-si, Gyeonggi-do (KR)

(72) Inventor: Tae-Young Yoon, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/194,647

(22) Filed: Feb. 28, 2014

(65) Prior Publication Data

US 2014/0246771 A1 Sep. 4, 2014

(30) Foreign Application Priority Data

Mar. 4, 2013 (KR) .......................... 10-2013-0022668

(51) Int. Cl.
*H05K 1/11* (2006.01)
*H05K 3/24* (2006.01)
(Continued)

(52) U.S. Cl.
CPC ............... *H05K 1/116* (2013.01); *H05K 3/242* (2013.01); *Y10T 29/49165* (2015.01); *Y10T 29/49155* (2015.01); *H01L 23/3128* (2013.01); *H01L 24/16* (2013.01); *H01L 24/32* (2013.01); *H01L 24/48* (2013.01); *H01L 24/73* (2013.01); *H01L 25/0657* (2013.01); *H01L 2224/16145* (2013.01); *H01L 2224/16235* (2013.01); *H01L 2224/32145* (2013.01); *H01L 2224/48091* (2013.01); *H01L 2224/48227* (2013.01);
(Continued)

(58) Field of Classification Search
CPC .. H05K 1/116; H05K 3/242; H01L 23/49827; H01L 25/5381; H01L 25/0657; H01L 23/49866; H01L 23/481; Y10T 29/49155; Y10T 29/49165
See application file for complete search history.

(56) References Cited

U.S. PATENT DOCUMENTS 7,030,500 B2 4/2006 Shin et al.
7,213,333 B2 5/2007 Mita
(Continued)

FOREIGN PATENT DOCUMENTS

JP 2009016591 A 1/2009
JP 2010232579 A 10/2010
(Continued)

*Primary Examiner* — William Coleman
(74) *Attorney, Agent, or Firm* — Renaissance IP Law Group LLP (57) ABSTRACT

A package substrate may include an insulating substrate, a first land array, a second land array, a first plating line and a second plating line. The first land array may be arranged on a first surface of the insulating substrate. The second land array may be arranged on a second surface of the insulating substrate opposite to the first surface. The second land array may be electrically connected to the first land array. The second land array may include outer lands and inner lands. The first plating line may be connected to the outer lands. The second plating line may be connected between the outer lands and the inner lands. The second plating line may have a width narrower than that of the first plating line. The second plating line may be removed by applying a removing current to the first plating line prior to the first plating line.

20 Claims, 7 Drawing Sheets

(51) Int. Cl.
　　　*H01L 25/065*　　(2006.01)
　　　*H01L 23/48*　　(2006.01)
　　　*H01L 23/498*　　(2006.01)
　　　*H01L 23/538*　　(2006.01)
　　　*H01L 23/31*　　(2006.01)
　　　*H01L 23/00*　　(2006.01)

(52) U.S. Cl.
　　　CPC .............. *H01L 2224/48235* (2013.01); *H01L 2224/73265* (2013.01); *H01L 2225/0651* (2013.01); *H01L 2225/06517* (2013.01); *H01L 2924/15311* (2013.01); *H01L2225/06513* (2013.01); *H01L 2225/06541* (2013.01); *H01L 2225/06562* (2013.01); *H01L 23/481* (2013.01); *H01L 23/49827* (2013.01); *H01L 23/49866* (2013.01); *H01L 23/5381* (2013.01)

(56) References Cited

U.S. PATENT DOCUMENTS

| | | | |
|---|---|---|---|
| 7,374,654 B1 * | 5/2008 | Chang et al. | 205/674 |
| 8,061,024 B2 | 11/2011 | Lee et al. | |
| 2004/0106288 A1 * | 6/2004 | Igarashi et al. | 438/689 |
| 2006/0014370 A1 * | 1/2006 | Chowdhury et al. | 438/613 |
| 2009/0321266 A1 | 12/2009 | Egawa et al. | |
| 2011/0048784 A1 | 3/2011 | Kim et al. | |
| 2011/0163930 A1 * | 7/2011 | De Lustrac et al. | 343/777 |

FOREIGN PATENT DOCUMENTS

| | | |
|---|---|---|
| JP | 4880524 B2 | 2/2012 |
| KR | 20030072855 A | 9/2003 |
| KR | 100499003 B1 | 7/2005 |
| KR | 20090016257 A | 2/2009 |
| KR | 101064754 B1 | 9/2011 |

* cited by examiner

PACKAGE SUBSTRATE, METHOD OF MANUFACTURING THE PACKAGE SUBSTRATE AND SEMICONDUCTOR PACKAGE INCLUDING THE PACKAGE SUBSTRATE

CROSS-RELATED APPLICATION

This application claims priority under 35 USC §119 to Korean Patent Application No. 10-2013-0022668, filed on Mar. 4, 2013 in the Korean Intellectual Property Office (KIPO), the contents of which are herein incorporated by reference in their entirety.

BACKGROUND

1. Field

Example embodiments relate to a package substrate, a method of manufacturing the package substrate and a semiconductor package including the package substrate. More particularly, example embodiments relate to a package substrate having a land array, a method of manufacturing the package substrate and a semiconductor package including the package substrate.

2. Description of the Related Art

Generally, various semiconductor fabrication processes may include using a semiconductor substrate to form a plurality of semiconductor chips. In order to mount the semiconductor chips on a printed circuit board (PCB), a packaging process may be performed using the semiconductor chip to form a semiconductor package.

The semiconductor package may include a package substrate, a semiconductor chip and conductive connecting members. The semiconductor chip may be arranged on an upper surface of the package substrate. The conductive connecting members may electrically connect the semiconductor chip with the package substrate.

The package substrate may include a first land array to which the conductive connecting member may be connected. The package substrate may include a second land array on which external terminals may be mounted. The first land array and the second land array may be formed by an electroplating process. Thus, plating lines for supplying a current may be connected to the first land array and the second land array.

Recently, as semiconductor devices become more highly integrated, the number of input/output terminals of the semiconductor package may be greatly increased. In order to increase the input/output terminals, a pitch between the land arrays may be narrowed. However, because the package substrate may have a limited size, the land arrays having the narrow pitch may be arranged in at least three rows.

According to related arts, the plating line may be readily connected to an outermost land array positioned on an edge portion of the package substrate. In contrast, the plating line may not be easily connected to a central land array that is positioned on a central portion of the package substrate due to the narrow pitch of the land arrays.

SUMMARY

Example embodiments provide a package substrate having a structure where plating lines may be readily connected to rows of land arrays having a narrow pitch.

Example embodiments also provide a method of manufacturing the above-mentioned package substrate.

Example embodiments still also provide a semiconductor package including the above-mentioned package substrate.

According to some example embodiments, there may be provided a package substrate. The package substrate may include an insulating substrate, a first land array, a second land array, a first plating line and a second plating line. The first land array may be arranged on a first surface of the insulating substrate. The second land array may be arranged on a second surface of the insulating substrate opposite to the first surface. The second land array may be electrically connected to the first land array. The second land array may include outer lands and inner lands. The first plating line may be connected to the outer lands. The second plating line may be connected between the outer lands and the inner lands. The second plating line may have a width narrower than that of the first plating line. The second plating line may be removed by applying a removing current to the first plating line prior to the first plating line.

In example embodiments, the outer lands may be arranged in one row. The inner lands may be arranged in at least two rows. The second plating line may have a connecting line connected between the inner lands.

In example embodiments, the first plating line and the second plating line may be arranged on a straight line.

In example embodiments, the package substrate may further include a via contact formed in the insulating substrate to electrically connect the first land array with the second land array.

In example embodiments, the package substrate may further include a plating layer formed on the second land array by applying a plating current to the first plating line and the second plating line.

According to some example embodiments, there may be provided a method of manufacturing a package substrate. In the method of manufacturing the package substrate, a first land array may be formed on a first surface of an insulating substrate. A second land array may be formed on a second surface of the insulating substrate opposite to the first surface. The second land array may be electrically connected to the first land array. The second land array may include outer lands and inner lands. A first plating line may be connected to the outer lands. A second plating line may be connected between the outer lands and the inner lands. The second plating line may have a width narrower than that of the first plating line. A plating current may be supplied to the first plating line and the second plating line to form a plating layer on the second land array. A removing current may be supplied to the second plating line through the first plating line to remove the second plating line.

In example embodiments, the method may further include forming a via contact in the insulating substrate to electrically connect the first land array with the second land array.

In example embodiments, the first land array, the second land array and the via contact may be formed simultaneously with each other by a single plating process.

According to some example embodiments, there may be provided a semiconductor package. The semiconductor package may include a package substrate, a semiconductor chip and conductive connecting members. The package substrate may include an insulating substrate, a first land array, a second land array, a first plating line and a second plating line. The first land array may be arranged on a first surface of the insulating substrate. The second land array may be arranged on a second surface of the insulating substrate opposite to the first surface. The second land array may be electrically connected to the first land array. The second land array may include outer lands and inner lands. The first plating line may be connected to the outer lands. The second plating line may be connected between the outer lands and the inner lands. The second plating line may have a width narrower than that of the first plating line. The second plating line may be removed by applying a removing current to the first plating line prior to the first plating line. The semiconductor chip may be arranged on the insulating substrate. The conductive connecting members may electrically connect the semiconductor chip with the first land array.

In example embodiments, the conductive connecting members may include conductive wires, conductive bumps, etc.

In example embodiments, the semiconductor package may further include a second semiconductor chip stacked on the semiconductor chip.

In example embodiments, the second semiconductor chip may be electrically connected with the first land array.

In example embodiments, the second semiconductor chip may be electrically connected to a plug built in the semiconductor chip.

In example embodiments, the semiconductor package may further include external terminals mounted on the second land array.

In example embodiments, the semiconductor package may further include a molding member formed on the package substrate to cover the semiconductor chip.

According to example embodiments, the first plating line may be connected to the outer lands of the second land array. Further, the second plating line having a width narrower than that of the first plating line may be connected to the inner lands of the second land array. The second plating line having the narrow width may be readily formed between the second land arrays having a narrow pitch. When the removing current may be supplied to the first plating line and the second plating line, the second plating line may be removed prior to the first plating line to disconnect the inner lands from the outer lands. As a result, the plating process may be performed on the land arrays having a plurality of the rows so that many input/output terminals may be provided to the semiconductor package.

BRIEF DESCRIPTION OF THE DRAWINGS

Example embodiments will be more clearly understood from the following detailed description taken in conjunction with the accompanying drawings. FIGS. 1 to 12 represent non-limiting, example embodiments as described herein.

DETAILED DESCRIPTION OF THE EMBODIMENTS

Various example embodiments will be described more fully hereinafter with reference to the accompanying drawings, in which some example embodiments are shown. The disclosed subject matter may, however, be embodied in many different forms and should not be construed as limited to the example embodiments set forth herein. Rather, these example embodiments are provided so that this disclosure will be thorough and complete, and will fully convey the scope of the disclosed subject matter to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the disclosed subject matter.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the disclosed subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the disclosed subject matter.

Unless otherwise defined, all terms (including technical and scientific terms) used herein have the same meaning as commonly understood by one of ordinary skill in the art to which this disclosed subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Package Substrate

Figure 1:
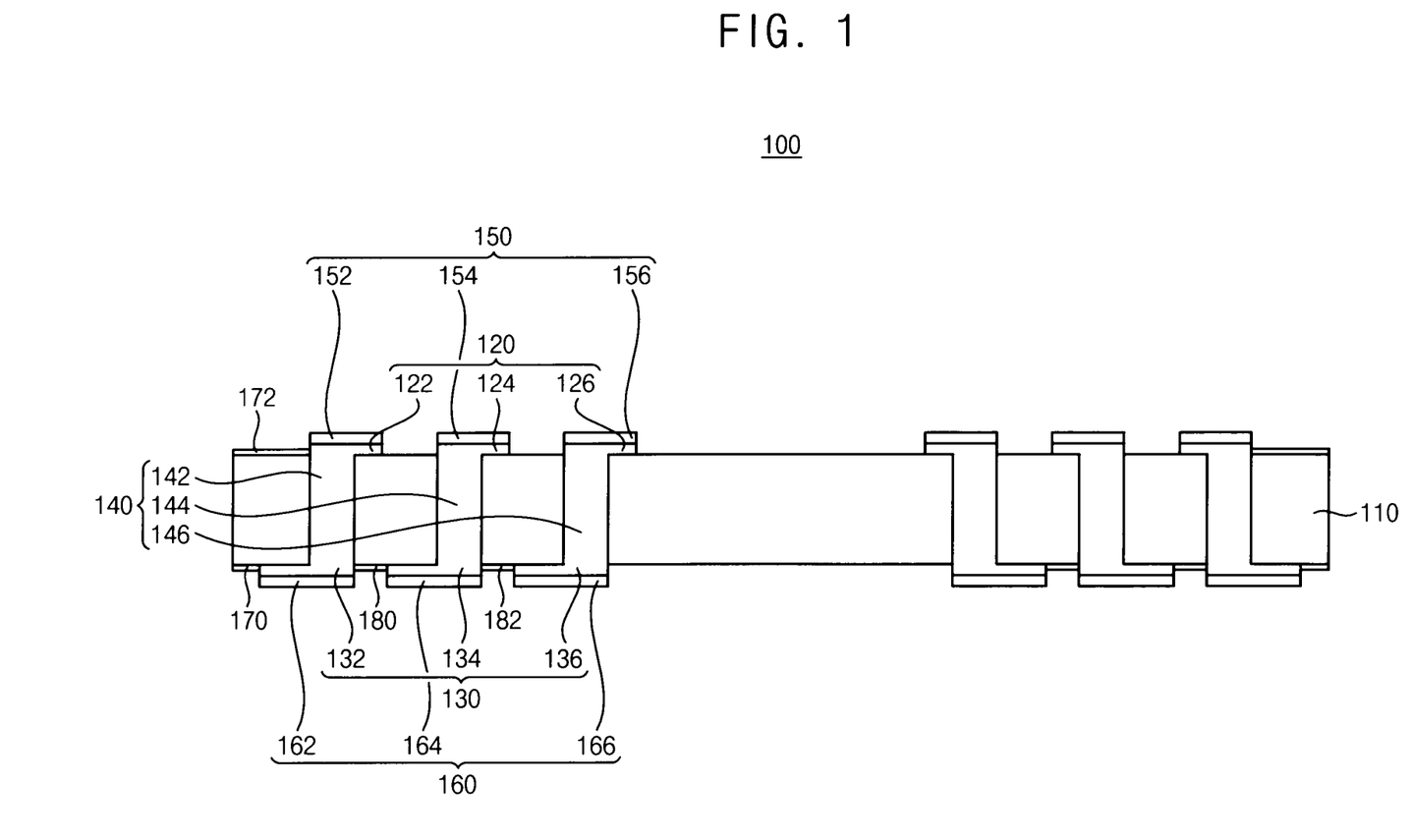
FIG. 1 is a cross-sectional view illustrating a package substrate in accordance with example embodiments.
Figure 2:
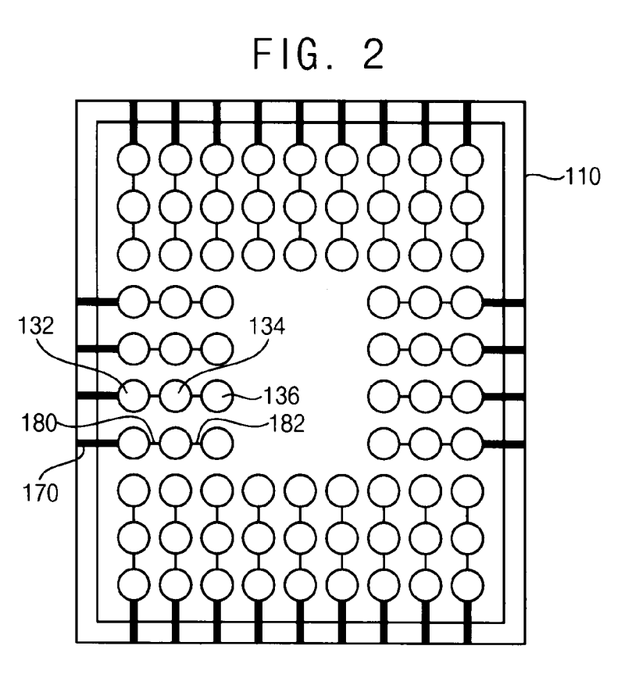
FIG. 2 is a bottom view illustrating the package substrate in FIG. 1.
Figure 3:
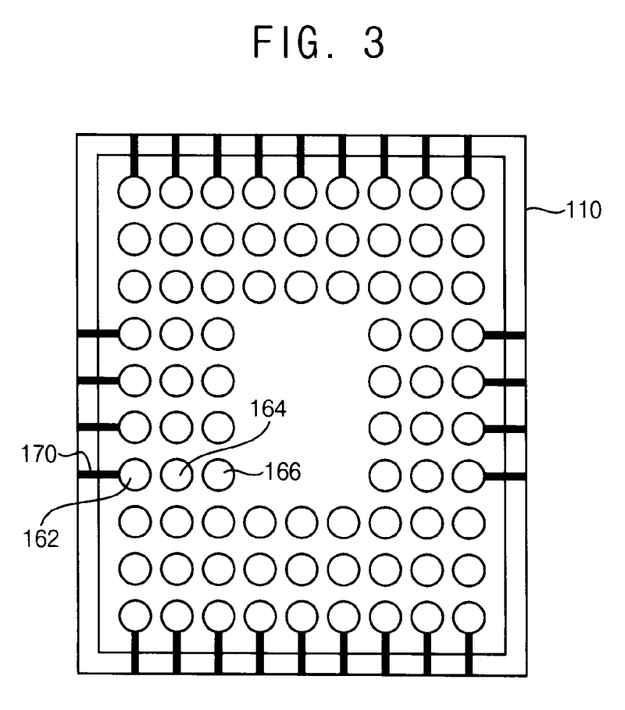
FIG. 3 is a bottom view illustrating the package substrate in FIG. 1 after performing a plating process.

FIG. 1 is a cross-sectional view illustrating a package substrate in accordance with example embodiments, FIG. 2 is a bottom view illustrating the package substrate in FIG. 1, and FIG. 3 is a bottom view illustrating the package substrate in FIG. 1 after performing a plating process.

Referring to FIGS. 1 and 2, a package substrate 100 of this example embodiment may include an insulating substrate 110, a first land array 120, a second land array 130, a via contact 140, an upper plating layer 150, a lower plating layer 160, a first plating line 170 and a second plating line 180.

In example embodiments, the insulating substrate 110 may have a rectangular cross-sectional shape. Thus, the insulating substrate 110 may have a first surface and a second surface opposite to the first surface. The first surface may correspond to an upper surface of the insulating substrate 110. The second surface may correspond to a lower surface of the insulating substrate 110. The insulating substrate 110 may include a plurality of via holes. The via holes may have numbers and arrangements corresponding to numbers and arrangements of the second land array 130, respectively. As shown in FIG. 2, the second land array 130 may be arranged in three rows. Therefore, the via holes may also be arranged in three rows.

The first land array 120 may be arranged on the upper surface of the insulating substrate 110. In example embodiments, the first land array 120 may be positioned on and edge portion of the upper surface of the insulating substrate 110. The number of lands of the first land array 120 may be substantially equal to that of the second land array 130. In one embodiment, the first land array 120 may include a first upper land 122, a second upper land 124 and a third upper land 126.

An upper plating line 172 may be connected to the first upper land 122, the second upper land 124 and the third upper land 126. A plating current may be applied to the first upper land 122, the second upper land 124 and the third upper land 126 through the upper plating line 172 to form the upper plating layer 150, which may be formed on the first upper land 122, the second upper land 124 and the third upper land 126. In example embodiments, the upper plating layer 150 may include a first upper plating layer 152 on the first upper land 122, a second upper plating layer 154 on the second upper land 124, and a third upper plating layer 156 on the third upper land 126.

In example embodiments, conductive connecting members (not shown) such as conductive wires, conductive bumps, etc., may make contact with the upper plating layer 150. The conductive connecting members may be electrically connected with a semiconductor chip (not shown). Because the conductive connecting members may have a very small size, the upper plating layer 150 may also have a very small size. Thus, the first upper land 122, the second upper land 124 and the third upper land 126 may also have a small size. This may provide the first upper land 122, the second upper land 124 and the third upper land 126 with sufficiently wide gaps. As a result, the upper plating line 172 may be individually connected to the first upper land 122, the second upper land 124 and the third upper land 126 through the wide gaps between the first to third upper lands 122, 124 and 126.

The second land array 130 may be arranged on the lower surface of the insulating substrate 110. In example embodiments, the second land array 130 may be arranged in three rows. The second land array 130 may include a first lower land 132, a second lower land 134 and a third lower land 136. The first lower land 132 may correspond to an outer land. The second lower land 134 and the third lower land 136 may correspond to an inner land.

In example embodiments, external terminals (not shown) such as solder balls may be mounted on the second land array 130. Because the external terminals may have a size larger than that of the conductive connecting members, the second land array 130 may have an area relatively larger than that of the first land array 120. Thus, respective gaps between the first to the third lower lands 132, 134 and 136 may be very narrow, relative to the first land array 120.

The via contact 140 may be formed in the via holes of the insulating substrate 110. In example embodiments, the via contact 140 may include a first via contact 142, a second via contact 144 and a third via contact 146. The first via contact 142, the second via contact 144 and the third via contact 146 may be electrically connected between the first land array 120 and the second land array 130. In example embodiments, the first land array 120, the second land array 130 and the via contact 140 may be substantially simultaneously formed by a single plating process. In some embodiments, the first land array 120, the second land array 130 and the via contact 140 may include copper.

The first plating line 170 may be connected to the first lower land 132 as the outer land. In example embodiments, the first plating line 170 may have a width substantially the same as that of the upper plating line 172. Because the respective gaps between the first, second, and third lower lands 132, 134 and 136 may be very narrow, it may be difficult to form the first plating line 170 between the first to third lower lands 132, 134 and 136.

In example embodiments, the second plating line 180 may be connected between the first lower land 132 (as the outer land) and the second lower land 134 (as the inner land) and may also electrically connect the first lower land 132 with the second lower land 134. The second lower land 134 may be connected with the first plating line 170 via the first lower land 132 and the second plating line 180. The first plating line 170 and the second plating line 180 may be positioned in a straight line.

In example embodiments, the second plating line 180 may have a width narrower than that of the first plating line 170. For example, the width of the first plating line 170 may be several times of the width of the second plating line 180. That is, the second plating line 180 may be very thin compared to the first plating line 170. Thus, the second plating line 180 having the very narrow width may be readily formed between the first lower land 132 and the second lower land 134. The width of the second plating line 180 may allow the plating current to be supplied to the second lower land 134 through the second plating line 180. That is, when the plating current passes through the second plating line 180, the second plating line 180 may not be cut.

In example embodiments, because the second land array 130 may include the third lower land 136, the second plating line 180 may further include a connecting line 182 connected between the second lower land 134 and the third lower land 136. The connecting line 182 may have a width substantially the same as that of the second plating line 180.

The plating current may be applied to the first lower land 132, the second lower land 134 and the third lower land 136 through the first plating line 170, the second plating line 180 and the connecting line 182. This may form the lower plating layer on the first lower land 132, the second lower land 134 and the third lower land 136. In example embodiments, the lower plating layer 160 may include a first lower plating layer 162 on the first lower land 132, a second lower plating layer 164 on the second lower land 134, and a third lower plating layer 166 on the third lower land 136.

In example embodiments, the upper plating layer 140 and the lower plating layer 160 may include a gold layer, a nickel layer, a gold/nickel layer, etc.

After forming the upper plating layer 150 and the lower plating layer 160, the first and third lower lands 132, 134 and 136 may be electrically connected with each other through the second plating line 180 and the connecting line 182. In order to prevent an electrical short between the external terminals on the second land array 130, it may be required to disconnect the electrical connections between the first to third lower lands 132, 134 and 136.

A removing current (higher than the plating current) may be supplied to the second plating line 180 and the connecting line 182 through the first plating line 170. As shown in FIG. 3, the second plating line 180 and the connecting line 182 may be removed by the removing current so that the first to third lower lands 132, 134, and 136 may be disconnect from each other.

In example embodiments, when the removing current may be too high, the first plating line 170 may be removed by the high removing current prior to supplying the removing current to the second plating line 180 and the connecting line 182. In contrast, when the removing current may be too low, the amount of time for removing the second plating line 180 and the connecting line 182 using the low removing current may be increased. Therefore, the removing current may have a range for allowing the second plating line 180 and the connecting line 182 to be removed without removal of the first plating line 170.

In example embodiments, the second land array 130 may be arranged in the three rows. Alternatively, the second land array 130 may be arranged in two rows or at least four rows.

Method of Manufacturing a Semiconductor Substrate

FIGS. 4 to 7 are cross-sectional views illustrating a method of manufacturing the package substrate in FIG. 1.

Figure 4:
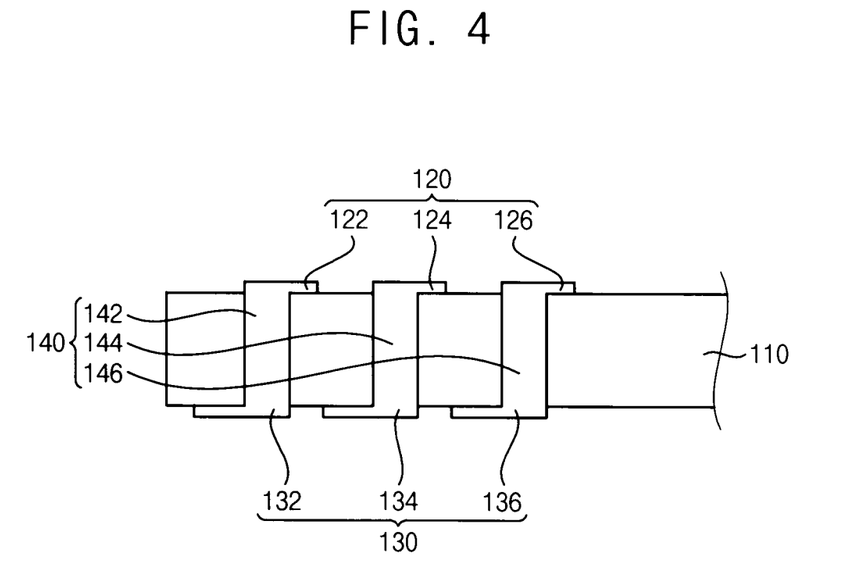
FIGS. 4, 5, 6, and 7 are each cross-sectional views illustrating a method of manufacturing the package substrate in FIG. 1.

Referring to FIG. 4, the first land array 120, the second land array 130 and the via contact 140 may be formed at the insulating substrate 110. In example embodiments, the first land array 120, the second land array 130 and the via contact 140 may be substantially simultaneously formed by a single plating process. Particularly, a seed layer (not shown) may be formed on the upper surface and the lower surface of the insulating substrate 110 and inner surfaces of the via holes. The plating process may be performed on the seed layer to form the first land array 120 on the upper surface of the insulating substrate 110, the second layer array 130 on the lower surface of the insulating substrate 110, and the via contact 140 in the via holes of the insulating substrate 110. Additionally, the first land array 120 and the second land array 130 may be planarized.

Figure 5:
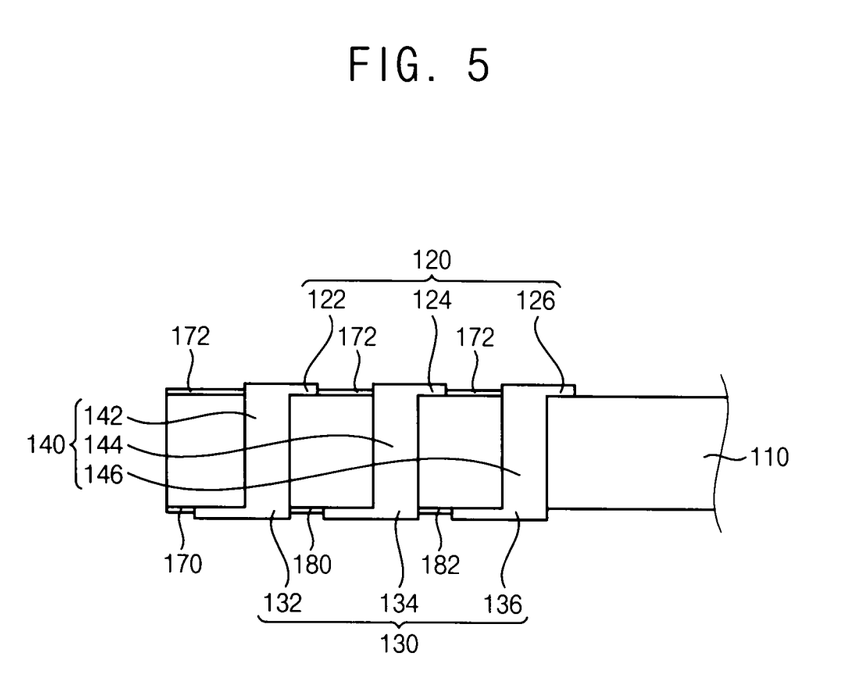

Referring to FIG. 5, the upper plating line 172 may be formed on the upper surface of the insulating substrate 110. The upper plating line 172 may be electrically connected to the first land array 120. In example embodiments, because the gap between the first land arrays 120 may be sufficiently wide, the upper plating line 172 may be easily formed on the upper surface of the insulating substrate 110 between the first land arrays 120.

The first plating line 170 may be formed on the lower surface of the insulating substrate 110. The first plating line 170 may be electrically connected to the first lower land 132 corresponding to the outer land of the second land array 130.

The second plating line 180 may be formed between the first lower land 132 and the second lower land 134 to electrically connect the first lower land 132 and the second lower land 134 with each other. The connecting line 182 may be formed between the second lower land 134 and the third lower land 136 to electrically connect the second lower land 134 and the third lower land 136 with each other.

In example embodiments, as mentioned above, the second plating line 180 and the connecting line 182 may have a width narrower than that of the first plating line 180. Thus, the second plating line 180 and the connecting line 182 may be formed between the first, second, and third lower lands 132, 134 and 136 having the narrow pitch.

Figure 6:
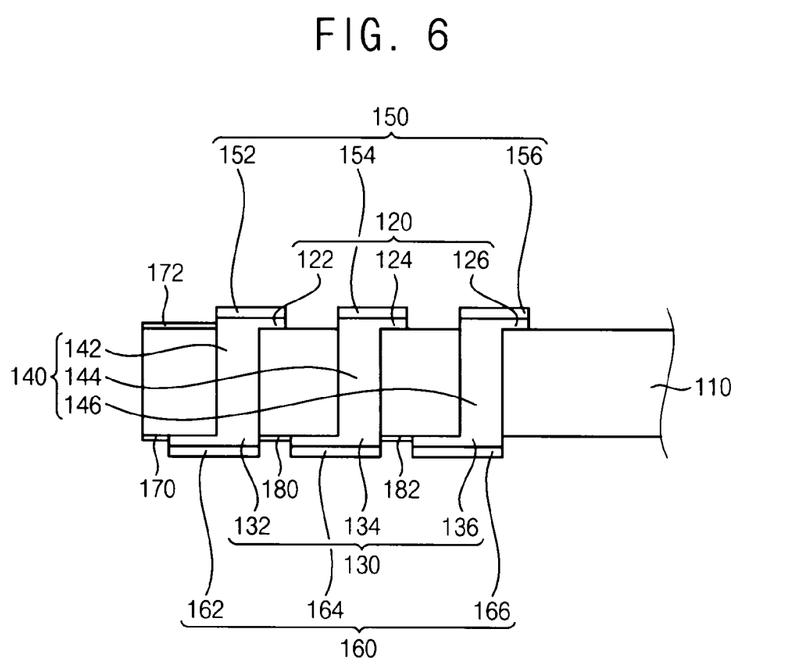

Referring to FIG. 6, the plating current may be supplied to the first land array 120 through the upper plating line 172 to form the upper plating layer 150 on the first land array 120.

The plating current may be supplied to the second land array 130 through the first plating line 170, the second plating line 180 and the connecting line 182 to form the lower plating layer 160 on the second land array 130.

Figure 7:
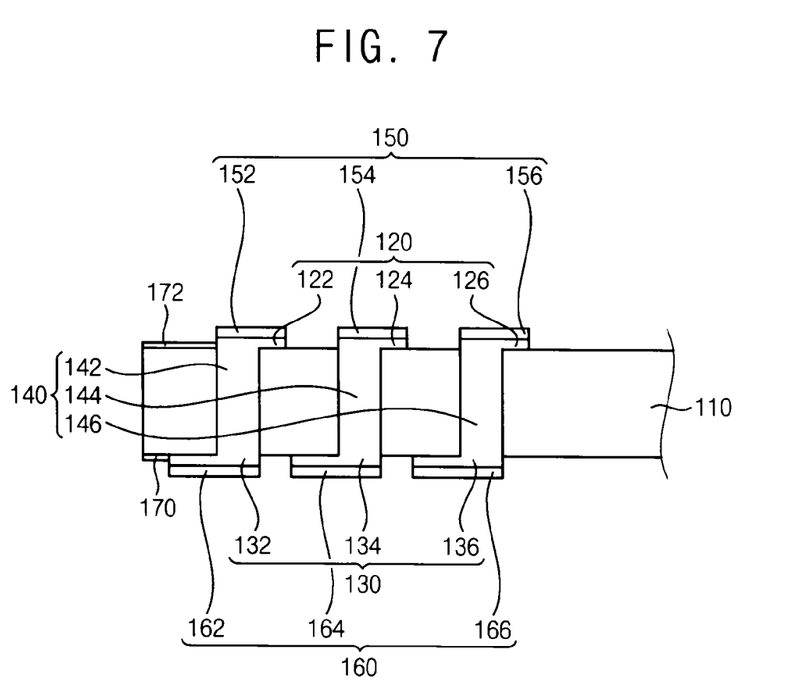

Referring to FIG. 7, the removing current higher than the plating current may be supplied to the second plating line 180 and the connecting line 182 through the first plating line 170 to remove the second plating line 180 and the connecting line 182. During which the second plating line 180 and the connecting line 182 may be completely or mostly removed, the first plating line 170 may not be removed or only partially removed. Thus, the first lower plating layer 162, the second lower plating layer 164 and the third lower plating layer 164 in the lower plating layer 160 may be disconnected from each other.

Figure 8:
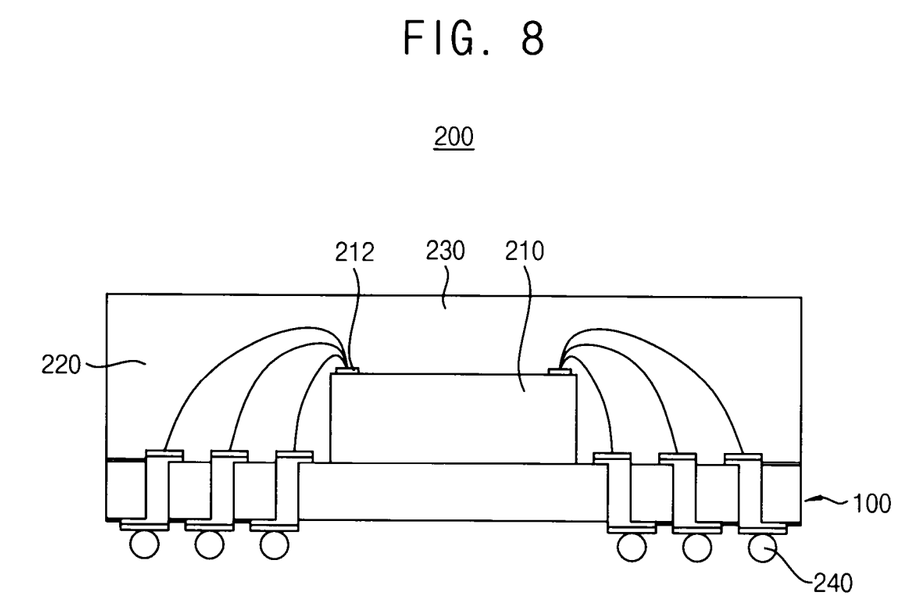
FIG. 8 is a cross-sectional view illustrating a semiconductor package including the package substrate in FIG. 1 in accordance with example embodiments.

FIG. 8 is a cross-sectional view illustrating a semiconductor package including the package substrate in FIG. 1 in accordance with example embodiments.

Referring to FIG. 8, a semiconductor package 200 of this example embodiment may include package substrate 100, a semiconductor chip 210, conductive wires 220, a molding member 230 and external terminals 240.

In example embodiments, the package substrate 100 may include elements substantially the same as those of the package substrate 100 in FIG. 1. Thus, the same reference numerals may refer to the same elements and any further illustrations with respect to the same elements may be omitted herein for brevity.

The semiconductor chip 210 may be arranged on the upper surface of the package substrate 100. The semiconductor chip 210 may include bonding pads 212. In example embodiments, the bonding pads 212 may be arranged on an upper surface of the semiconductor chip 210.

The conductive connecting members of this example embodiment may include the conductive wires 220. The conductive wires 220 may be electrically connected between the bonding pads 212 of the semiconductor chip 210 and the first land array 120 of the package substrate 100.

The molding member 230 may be formed on the upper surface of the package substrate 100 to cover the semiconductor chip 210. In example embodiments, the molding member 230 may include an epoxy molding compound (EMC).

The external terminals 240 may be mounted on the lower plating layer 160 of the package substrate 100. In example embodiments, the external terminals 240 may include solder balls.

Figure 9:
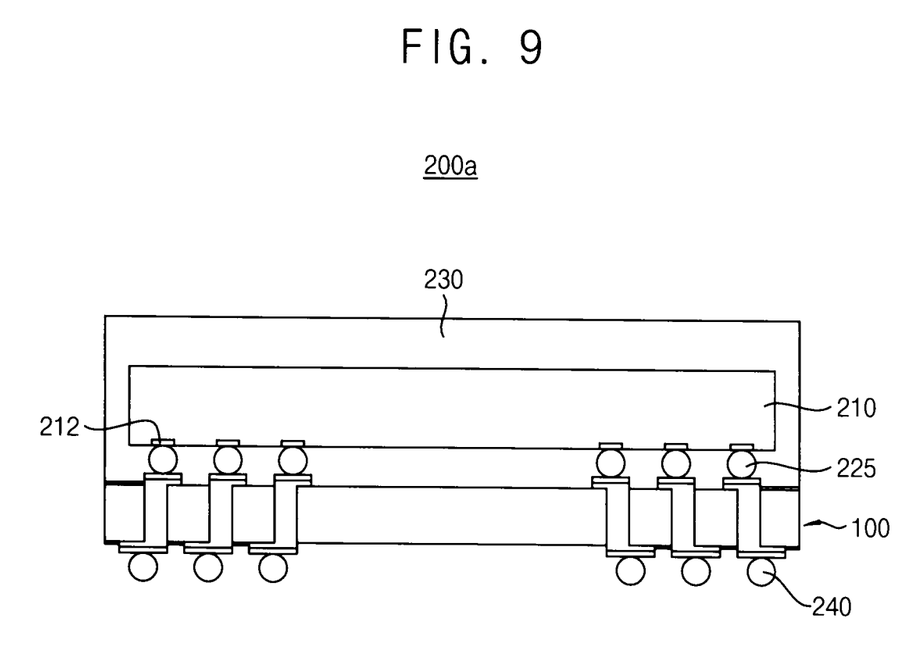
FIG. 9 is a cross-sectional view illustrating a semiconductor package including the package substrate in FIG. 1 in accordance with example embodiments.

FIG. 9 is a cross-sectional view illustrating a semiconductor package including the package substrate in FIG. 1 in accordance with example embodiments.

A semiconductor package 200a of this example embodiment may include elements substantially the same as those of the semiconductor package 200 in FIG. 8 except for conductive connecting members. Thus, the same reference numerals may refer to the same elements and any further illustrations with respect to the same elements may be omitted herein for brevity.

Referring to FIG. 9, the semiconductor package 200 of this example embodiment may include conductive bumps 225 as the conductive connecting members. Thus, the bonding pads 212 may be arranged on the lower surface of the semiconductor chip 210. The conductive bumps 225 may be interposed between the bonding pads 212 and the first land array 120 to electrically connect the semiconductor chip 210 with the package substrate 100.

Figure 10:
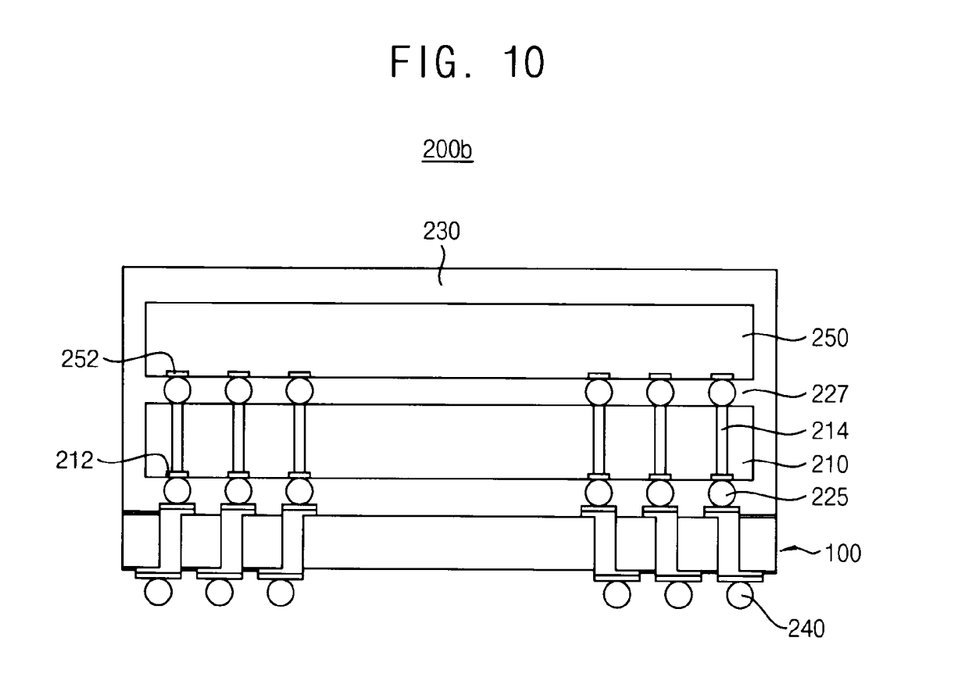
FIG. 10 is a cross-sectional view illustrating a semiconductor package including the package substrate in FIG. 1 in accordance with example embodiments.

FIG. 10 is a cross-sectional view illustrating a semiconductor package including the package substrate in FIG. 1 in accordance with example embodiments.

A semiconductor package 200b of this example embodiment may include elements substantially the same or similar to those of the semiconductor package 200a in FIG. 9 except for further including a second semiconductor chip. Thus, the same reference numerals may refer to the same elements and any further illustrations with respect to the same elements may be omitted herein for brevity.

Referring to FIG. 10, the semiconductor package 200b of this example embodiment may further include a second semiconductor chip 250. The second semiconductor chip 250 may be stacked on the upper surface of the semiconductor chip 210. Second bonding pads 252 may be arranged on a lower surface of the second semiconductor chip 250. The second semiconductor chip 250 may be electrically connected with the semiconductor chip 210 via second conductive bumps 227.

The semiconductor chip 210 may include plugs 214. The plugs 214 may be vertically formed in the semiconductor chip 210. Each of the plugs 214 may have a lower end connected to the conductive bump 225, and an upper end connected to the second conductive bump 277.

Figure 11:
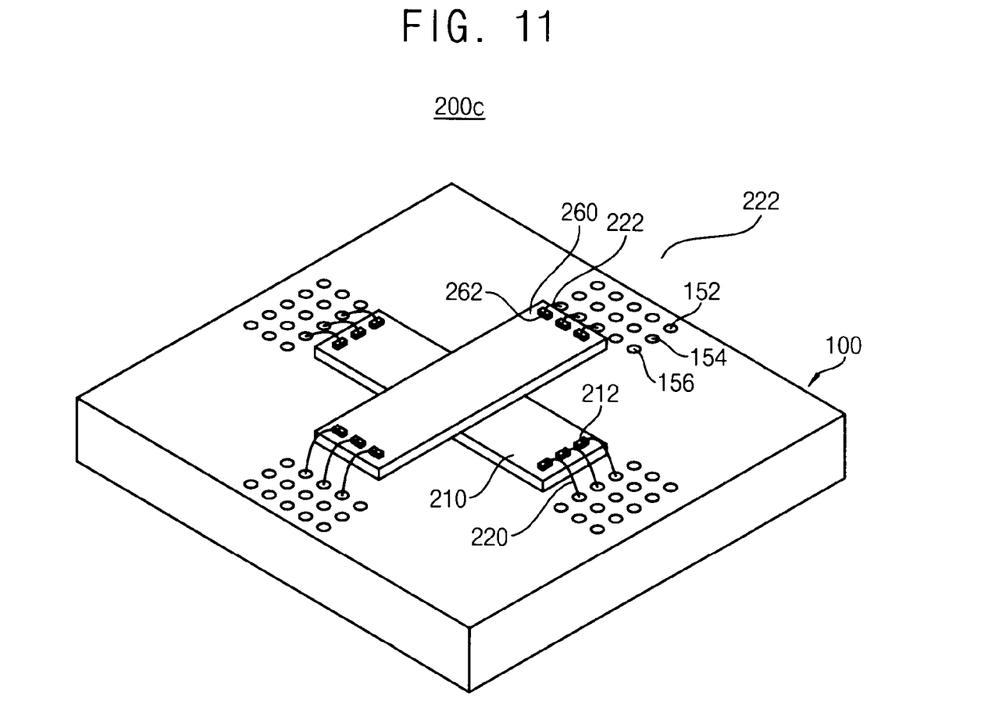
FIG. 11 is a cross-sectional view illustrating a semiconductor package including the package substrate in FIG. 1 in accordance with example embodiments.

FIG. 11 is a cross-sectional view illustrating a semiconductor package including the package substrate in FIG. 1 in accordance with example embodiments.

A semiconductor package 200c of this example embodiment may include elements substantially the same as those of the semiconductor package 200 in FIG. 8 except for further including a second semiconductor chip. Thus, the same reference numerals may refer to the same elements and any further illustrations with respect to the same elements may be omitted herein for brevity.

Referring to FIG. 11, the semiconductor package 200c of this example embodiment may further include a second semiconductor chip 260. The second semiconductor chip 260 may be stacked on the upper surface of the semiconductor chip 210. Second bonding pads 262 may be arranged on an upper surface of the second semiconductor chip 260. The second semiconductor chip 260 may be crosswise stacked on the semiconductor chip 210. The second bonding pads 262 may be electrically connected with the upper plating layer 150 on the first land array 120 of the package substrate 110 via second conductive wires 222.

According to example embodiments, the first plating line may be connected to the outer lands of the second land array. Further, the second plating line having a width narrower than that of the first plating line may be connected to the inner lands of the second land array. The second plating line having the narrow width may be readily formed between the second land arrays having a narrow pitch. When the removing current may be supplied to the first plating line and the second plating line, the second plating line may be removed prior to the first plating line to disconnect the inner lands from the outer lands. As a result, the plating process may be performed on the land arrays having a plurality of the rows so that many input/output terminals may be provided to the semiconductor package.

Figure 12:
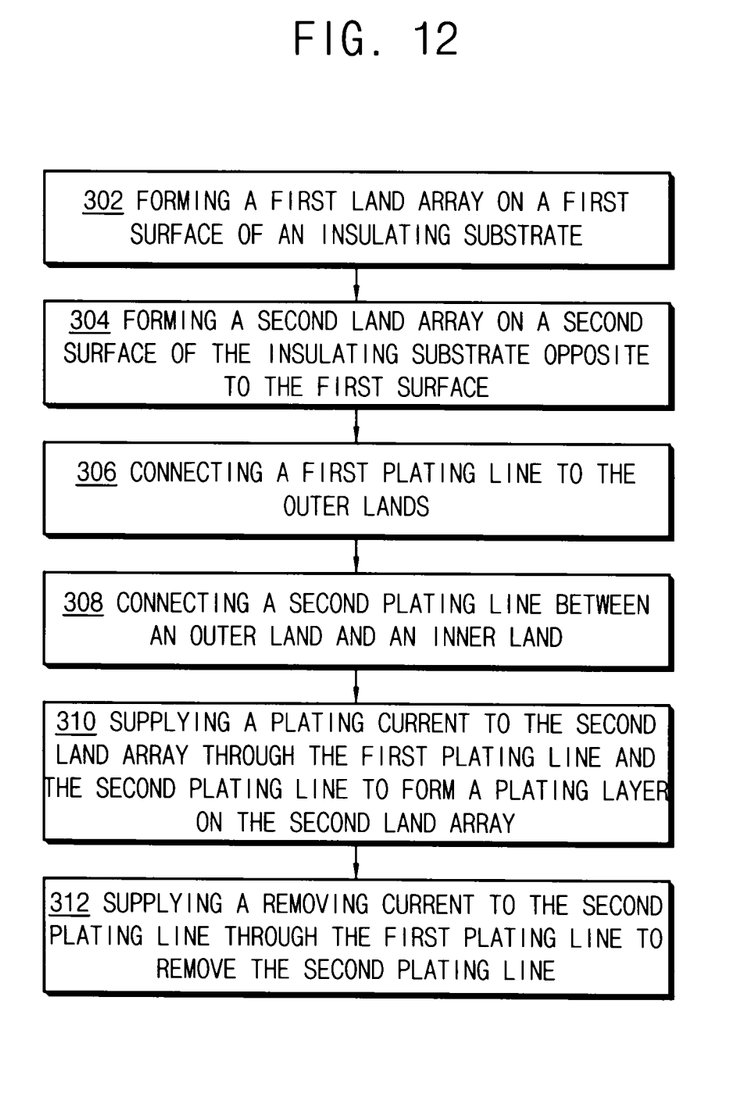
FIG. 12 is a flowchart illustrating a technique for manufacturing a semiconductor package including the package substrate in FIG. 1 in accordance with example embodiments.

FIG. 12 is a flow chart of an example embodiment of a technique 300 in accordance with the disclosed subject matter. In various embodiments, the technique 300 may be used or produced by or produce the systems such as those of FIGS. 1-11. Although, it is understood that the above are merely a few illustrative examples to which the disclosed subject matter is not limited. It is understood that the disclosed subject matter is not limited to the ordering of or number of actions illustrated by technique 300.

Block 302 illustrates that, in one embodiment, a first land array may be formed on a first surface of an insulating substrate, as described above. Block 304 illustrates that, in one embodiment, a second land array may be formed on a second surface of the insulating substrate opposite to the first surface, as described above. In such an embodiment, the second land array may include outer lands and inner lands electrically connected to the first land array, as described above.

Block 306 illustrates that, in one embodiment, a first plating line may be connected with the outer lands, as described above. Block 308 illustrates that, in one embodiment, a second plating line may be connected between an outer land and an inner land, as described above. In such an embodiment, the second plating line may have a width narrower than a width of the first plating line, as described above.

Block 310 illustrates that, in one embodiment, a plating current may be supplied to the second land array through the first plating line and the second plating line to form a plating layer on the second land array, as described above. In one embodiment, the plating layer on the second land array may include an outer plating layer disposed on the outer land and an inner plating layer disposed on the inner land, as described above.

Block 312 illustrates that, in one embodiment, a removing current may be supplied to the second plating line through the first plating line to remove the second plating line, as described above. In some embodiments, supplying the removing current may include ceasing removing current after the second plating line has been removed but before the first plating line is removed, as described above. In such an embodiment, supplying the removing current, as described below, may include disconnecting the outer plating layer from the inner plating layer.

In some embodiments, technique 300 may also include forming a via contact in the insulating substrate to electrically connect the first land array with the second land array, as described above. In some embodiments, the first land array, the second land array and the via contact may be formed by a single plating process, as described above.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the disclosed subject matter. Accordingly, all such modifications are intended to be included within the scope of the disclosed subject matter as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A package substrate comprising:
    an insulating substrate;
    a first land array arranged on a first surface of the insulating substrate;
    a second land array arranged on a second surface of the insulating substrate opposite to the first surface and electrically connected to the first land array, the second land array including outer lands and inner lands;
    a first plating line connected to the outer lands; and
    a second plating line disposed between the outer lands and the inner lands, the second plating line having a width narrower than that of the first plating line, wherein the second plating line is configured to be removed by a removing current, which is supplied through the first plating line.

2. The package substrate of claim 1, wherein the outer lands are arranged in one row, the inner lands are arranged in two rows, and the second plating line comprises a connecting line disposed between the inner lands arranged in the two rows.

3. The package substrate of claim 1, wherein the first plating line and the second plating line are positioned in a straight line.

4. The package substrate of claim 1, further comprising a via contact formed in the insulating substrate and the via contact configured to electrically connect the first land array with the second land array.

5. The package substrate of claim 1, further comprising a plating layer formed on the second land array by a plating current supplied through the first plating line and the second plating line.

6. The package substrate of claim 1, wherein the first plating line is configured to be removed by the removing current only after the second plating line has been removed.

7. A method of manufacturing a package substrate, the method comprising:
    forming a first land array on a first surface of an insulating substrate;
    forming a second land array on a second surface of the insulating substrate opposite to the first surface, the second land array including outer lands and inner lands electrically connected to the first land array;
    connecting a first plating line to the outer lands; and
    connecting a second plating line between an outer land and an inner land, the second plating line having a width narrower than a width of the first plating line;
    supplying a plating current to the second land array through the first plating line and the second plating line to form a plating layer on the second land array; and
    supplying a removing current to the second plating line through the first plating line to remove the second plating line.

8. The method of claim 7, further comprising forming a via contact in the insulating substrate to electrically connect the first land array with the second land array.

9. The method of claim 7, wherein supplying the removing current includes ceasing the removing current after the second plating line has been removed but before the first plating line is removed.

10. The method of claim 7, wherein the plating layer on the second land array includes an outer plating layer disposed on the outer land and an inner plating layer disposed on the inner land.

11. The method of claim 8, wherein the first land array, the second land array and the via contact are formed by a single plating process.

12. The method of claim 10, wherein supplying the removing current includes disconnecting the outer plating layer from the inner plating layer.

13. A semiconductor package comprising:
    a package substrate including:
        an insulating substrate,
        a first land array arranged on a first surface of the insulating substrate,
        a second land array arranged on a second surface of the insulating substrate opposite to the first surface and electrically connected to the first land array, the second land array including outer lands and inner lands,
        a first plating line connected to the outer lands, and
        a second plating line connected between the outer lands and the inner lands,
        the second plating line having a width narrower than a width of the first plating line, wherein the second plating line is configured to be removed by a removing current, which is supplied through the first plating line;
    a semiconductor chip arranged on the package substrate; and
    conductive connecting members electrically connected between the semiconductor chip and the first land array.

14. The semiconductor package of claim 13, wherein the conductive connecting members comprise conductive wires or conductive bumps.

15. The semiconductor package of claim 13, further comprising a second semiconductor chip stacked on the semiconductor chip.

16. The semiconductor package of claim 13, further comprising external terminals mounted on the second land array.

17. The semiconductor package of claim 13, further comprising a molding member formed on the package substrate to cover the semiconductor chip.

18. The semiconductor package of claim 13, wherein the removing current is configured to remove the second plating line before removing the first plating line.

19. The semiconductor package of claim 15, wherein the second semiconductor chip is electrically connected with the first land array.

20. The semiconductor package of claim 15, wherein the second semiconductor chip is electrically connected to a plug built in the semiconductor chip.

* * * * *